(12) United States Patent
Van Der Pasch et al.

(10) Patent No.: US 7,265,366 B2
(45) Date of Patent: Sep. 4, 2007

(54) LITHOGRAPHIC APPARATUS AND DEVICE MANUFACTURING METHOD

(75) Inventors: Engelbertus Antonius Fransiscus Van Der Pasch, Oirschot (NL); Marcel Hendrikus Maria Beems, Veldhoven (NL); Martinus Hendrikus Antonius Leenders, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 51 days.

(21) Appl. No.: 10/813,682

(22) Filed: Mar. 31, 2004

(65) Prior Publication Data

US 2005/0218342 A1  Oct. 6, 2005

(51) Int. Cl.
*A61N 5/00* (2006.01)
*G21G 5/00* (2006.01)

(52) U.S. Cl. .............. 250/492.2; 250/492.21; 250/492.22; 250/492.3; 250/504 R; 250/370.08; 250/370.09; 250/372; 378/34

(58) Field of Classification Search ............ 250/492.2, 250/494.1, 504 R, 526, 559.3, 559.01, 559.29; 430/395, 396; 355/18, 66, 77; 356/399–401
See application file for complete search history.

(56) References Cited

U.S. PATENT DOCUMENTS

| | | | | |
|---|---|---|---|---|
| 4,870,452 A * | 9/1989 | Tanimoto et al. .............. 355/53 |
| 5,138,176 A * | 8/1992 | Nishi ........................ 250/548 |
| 5,184,196 A * | 2/1993 | Nakagawa et al. ......... 356/401 |
| 5,739,898 A | 4/1998 | Ozawa et al. |
| 5,850,279 A * | 12/1998 | Nara et al. .................... 355/53 |
| 5,859,439 A * | 1/1999 | Nam et al. .................. 250/548 |
| 5,926,298 A * | 7/1999 | Li ............................... 385/24 |
| 6,137,574 A * | 10/2000 | Hill ............................ 356/486 |
| 6,208,707 B1 | 3/2001 | Oshino |
| 6,219,130 B1 * | 4/2001 | Kawakubo .................... 355/67 |
| 6,724,486 B1 * | 4/2004 | Shull et al. ................. 356/486 |
| 6,844,918 B2 * | 1/2005 | Navarro Y Koren et al. . 355/53 |
| 6,924,885 B2 * | 8/2005 | Botma .......................... 355/71 |
| 2001/0026354 A1 | 10/2001 | Aoki |
| 2001/0026402 A1 | 10/2001 | Gerhard et al. |
| 2002/0064796 A1 * | 5/2002 | Stryer et al. .................. 435/6 |
| 2003/0162135 A1 * | 8/2003 | Okoroanyanwu et al. ... 430/394 |
| 2004/0130690 A1 * | 7/2004 | Koren et al. ................. 355/53 |
| 2004/0165168 A1 * | 8/2004 | Botma ........................ 355/67 |
| 2004/0207836 A1 * | 10/2004 | Chhibber et al. ........ 356/237.4 |
| 2004/0256575 A1 * | 12/2004 | Singer et al. ............ 250/492.2 |
| 2005/0078292 A1 * | 4/2005 | Bruebach ..................... 355/67 |
| 2005/0110965 A1 * | 5/2005 | Hendriks et al. ............. 355/18 |

(Continued)

*Primary Examiner*—Robert Kim
*Assistant Examiner*—Bernard Souw
(74) *Attorney, Agent, or Firm*—Pillsbury Winthrop Shaw Pittman LLP

(57) ABSTRACT

A lithographic apparatus includes a radiation source configured to provide radiation to an illumination system, the radiation source configured to provide radiation in a first wavelength range and in a second wavelength range, the second wavelength range being different from the first wavelength range. A support is configured to support a patterning device, the patterning device is configured to impart the radiation with a pattern in its cross-section. A substrate table is configured to hold a substrate, and a projection system is configured to project the patterned radiation onto a target portion of a substrate. The first wavelength range is the primary wavelength of the lithographic apparatus. The second wavelength range is used for setup of the lithographic apparatus, the setup including one or more of calibration, qualification, performance test, and alignment. The second wavelength range may also be used for exposure of a further substrate.

32 Claims, 2 Drawing Sheets

U.S. PATENT DOCUMENTS

| | | |
|---|---|---|
| 2005/0157383 A1* | 7/2005 | Tichenor et al. ............. 359/359 |
| 2005/0189502 A1* | 9/2005 | Van Bilsen et al. ...... 250/559.3 |
| 2005/0218342 A1* | 10/2005 | Van Der Pasch et al. 250/492.2 |
| 2005/0274897 A1* | 12/2005 | Singer et al. ............... 250/372 |
| 2006/0072107 A1* | 4/2006 | Onvlee et al. ........... 356/239.8 |
| 2006/0072108 A1* | 4/2006 | Onvlee et al. ........... 356/239.8 |
| 2006/0103033 A1* | 5/2006 | Van Haren et al. ......... 257/797 |
| 2007/0041015 A1* | 2/2007 | Van Bilsen ................. 356/401 |

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam in a given direction (the "scanning" direction) while synchronously scanning the substrate parallel or anti-parallel to this direction.

A lithographic apparatus may require a controlled environment, such as a vacuum environment, to be able to transmit radiation from the source to the target portion on the wafer. For example in lithographic apparatus using extreme UV (EUV) radiation (such as 13 nm), a controlled environment is needed, in which specific vapor and gas levels are below a predetermined level. The vapors and gasses may either absorb the EUV radiation, or promote contamination of optical surfaces in combination with the radiation. In an EUV lithographic apparatus, the controlled environment requires that the partial pressure of hydrocarbons (CxHy) is below $10^{-9}$ Torr, and the partial pressure of water ($H_2O$) is below $10^{-7}$ Torr. Each time the lithographic apparatus is opened, e.g. for maintenance purposes, the controlled environment must be (re-) established. This requires a lot of time (in the order of hours), during which the lithographic apparatus can not be used effectively.

Also, for lithographic apparatus using another type of radiation (e.g. 157 nm or 193 nm), a controlled environment is necessary, although the requirements for the controlled environment may be different from those of EUV type lithographic apparatus. This may require less time to (re-) establish the controlled environment, but still impacts on the effective operational use time of the lithographic apparatus. For example, when using radiation in a range around 157 nm, air and water vapor will absorb the 157 nm radiation. To be able to use the radiation effectively, a controlled environment is required, in which air and water vapor are below a predetermined concentration level. This may be accomplished by purging the beam path of the lithographic apparatus with a purge gas, such as nitrogen ($N_2$), helium (He) or a mixture of gasses which are substantially transparent to the radiation of the projection beam at 157 nm. In 193 nm systems, the radiation is absorbed by atmospheric oxygen, and the controlled environment should substantially eliminate the presence of this gas, e.g. by purging the system with dry nitrogen gas.

SUMMARY OF THE INVENTION

It is an aspect of the present invention to provide a lithographic apparatus and a device manufacturing method, which are more efficient in use (e.g., operational time).

According to one aspect of the invention, there is provided a lithographic apparatus including a radiation source configured to provide radiation to an illumination system, the radiation system configured to provide radiation in a first wavelength range and in a second wavelength range, the second wavelength range being different from the first wavelength range; a support configured to support a patterning device, the patterning device configured to impart the radiation with a pattern in its cross-section; a substrate table configured to hold a substrate; and a projection system configured to project the patterned radiation onto a target portion of the substrate.

Radiation in the first wavelength range may be used for exposing the substrate as the primary function of the lithographic apparatus. Radiation in the second wavelength range may be used during the time in which a controlled environment is established for use of the first wavelength range radiation. Use of the second wavelength range radiation may be for exposing a further substrate, or for performing calibration or other maintenance functions in the lithographic apparatus, for example. The radiation source may provide radiation in both wavelength ranges simultaneously, or in separate time windows. As a result, the effective operational time of the lithographic apparatus is increased.

In an embodiment of the present invention, the radiation source includes a radiation source configured to provide radiation in both the first and second wavelength range, and further includes a removable filter configured to provide the radiation in the first or second wavelength range. This embodiment allows the insertion of the second wavelength radiation into the normal radiation path of the lithographic apparatus when needed. The removable filter may be adapted to transmit radiation in either the first or second wavelength range. It is possible to use any still present particles in the atmosphere to absorb the first wavelength range radiation (effectively passing the second wavelength range radiation) during the controlled environment establishment phase, and filter out the second wavelength range radiation during operational use (first wavelength range) of the lithographic apparatus, for example.

In an alternative embodiment, the radiation source includes a first radiation source element configured to provide radiation in the first wavelength range, and a second radiation source element configured to provide radiation in the second wavelength range, and removable radiation director, such as a mirror, configured to direct radiation from the second radiation source element to the illumination system. In this embodiment, it is possible to add the second wavelength range radiation in the light path of the lithographic apparatus.

The first wavelength range is a wavelength range used only in a controlled environment, and the second wavelength range is used when the controlled environment is not established, for example. The controlled environment may depend on the type of lithographic apparatus, as discussed above, but may also only relate to the level of vacuum (e.g. less than $10^{-5}$ Torr, or even less than $10^{-7}$ Torr), for example. The controlled environment may also put restrictions on the levels of other gasses and vapors which may be involved in contamination of the lithographic apparatus, such as hydrocarbon or water levels.

In a further alternative embodiment, the first wavelength range is in an EUV region, for example, 13 nm. Also, the first wavelength range may be in a UV region, for example, 157 nm or 193 nm. The present invention can thus be applied in future types, but also in existing types, of lithographic apparatus.

As discussed above, the second wavelength range may be used for setup of the lithographic apparatus, the setup including one or more of (interferometer) calibration, qualification (such as determining mirror maps), performance test, and alignment. When applied in EUV type of lithographic apparatus, in which an controlled environment must be created which may take a long time, this embodiment provides for a more efficient use in time of the EUV lithographic apparatus.

As an alternative, or concurrently, the substrate is exposed using the first wavelength range, and the second wavelength range may be used for exposure of a further substrate. The EUV lithographic apparatus can then be used for non EUV exposures during pump down to the controlled (high vacuum) environment.

In a further embodiment of the present invention, the second wavelength range is in a region between 150 and 350 nm. In this wavelength region, the reflection of mirrors in an EUV lithographic apparatus is more than 2%, which allows the second wavelength range radiation to be used for alignment or calibration purposes.

According to a further aspect of the present invention, there is provided a device manufacturing method including providing radiation at a first wavelength range and at a second wavelength range, the second wavelength range being different from the first wavelength range; patterning the radiation in its cross section; and projecting the patterned radiation onto a target portion of the substrate. The first and second wavelength range radiation may be provided simultaneously, or in different time windows.

This method allows more efficient use of a lithographic apparatus, comparable to the lithographic apparatus embodiments of the present invention mentioned above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support supports, e.g., bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
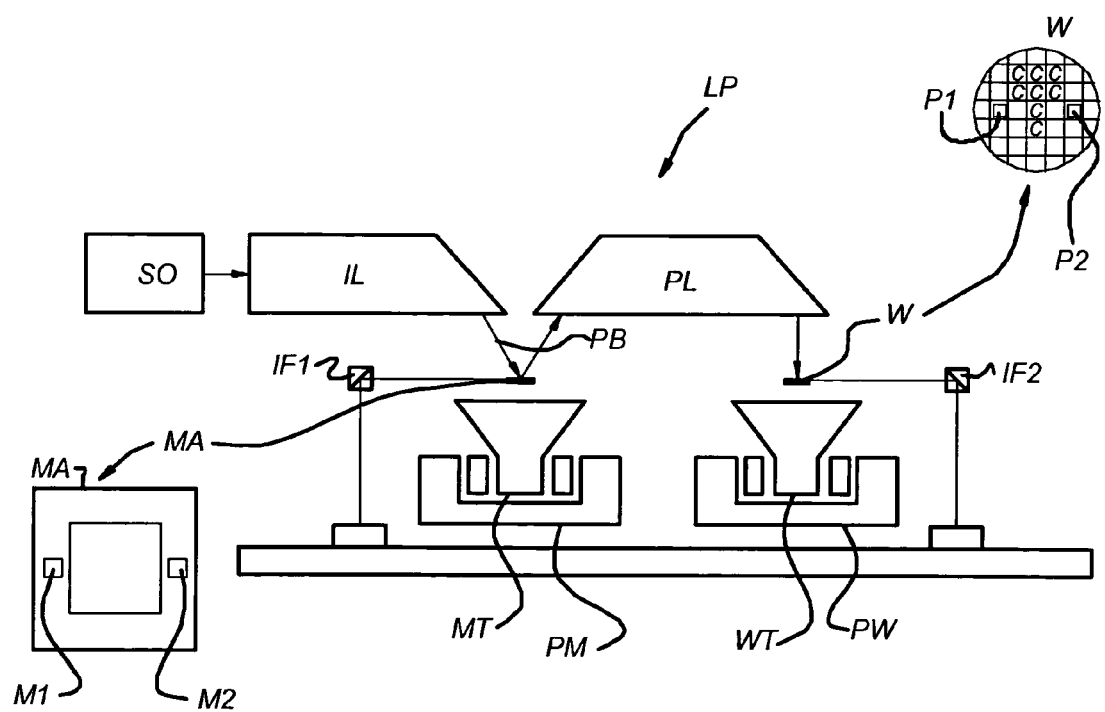
FIG. 1 depicts a lithographic apparatus according to an embodiment of the present invention.

FIG. 1 schematically depicts a lithographic apparatus LP according to an embodiment of the present invention. The apparatus includes an illumination system (illuminator) IL configured to provide a beam PB of radiation (e.g. UV or EUV radiation). A first support (e.g. a mask table) MT is configured to support a patterning device (e.g. a mask) MA and is connected to first positioning device PM that accurately positions the patterning device with respect to a projection system ("lens") PL. A substrate table (e.g. a wafer table) WT is configured to hold a substrate (e.g. a resist-coated wafer) W and is connected to second positioning device PW that accurately positions the substrate with respect to the projection system ("lens") PL.

The projection system (e.g. a reflective projection lens) PL is configured to image a pattern imparted to the beam PB by the patterning device MA onto a target portion (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL provides a beam of radiation PB from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL may be referred to as a radiation system.

The illuminator IL may include an adjusting device configured to adjust the angular intensity distribution of the beam PB. Generally, at least the outer and/or inner radial extent (commonly referred to as σ-outer and σ-inner, respectively) of the intensity distribution in a pupil plane of the illuminator can be adjusted. The illuminator provides a conditioned beam of radiation having a desired uniformity and intensity distribution in its cross-section.

The beam PB is incident on the mask MA, which is held on the mask table MT. Being reflected by the mask MA, the beam PB passes through the lens PL, which focuses the beam onto a target portion of the substrate W. With the aid of the second positioning device PW and a position sensor IF2 (e.g. an interferometric device), the substrate table WT can be moved accurately, e.g. so as to position different target portions in the path of the beam PB. Similarly, the first positioning device PM and a position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam is projected onto a target portion at once (i.e. a single static exposure). The substrate table WT is then shifted in the X and/or Y direction so that a different target portion can be exposed. In step mode, the maximum size of the exposure field limits the size of the target portion imaged in a single static exposure.
2. In scan mode, the mask table MT and the substrate table WT are scanned synchronously while a pattern imparted to the beam is projected onto a target portion (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the beam is projected onto a target portion. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus described above, e.g. working with EUV radiation to expose the substrate W, requires an ultra high vacuum environment, as 13 nm wavelength radiation is absorbed by many of the molecules in a normal atmosphere. To reach the ultra high vacuum environment, all spaces in the lithographic apparatus in which the exposure radiation propagates need to be in an ultra high vacuum environment. For this, the major part of the lithographic apparatus and its components are put in a vacuum chamber. The process of evacuating the vacuum chamber may take as long as several hours, in which the lithographic apparatus can not be used to normally expose substrates.

Figure 2:
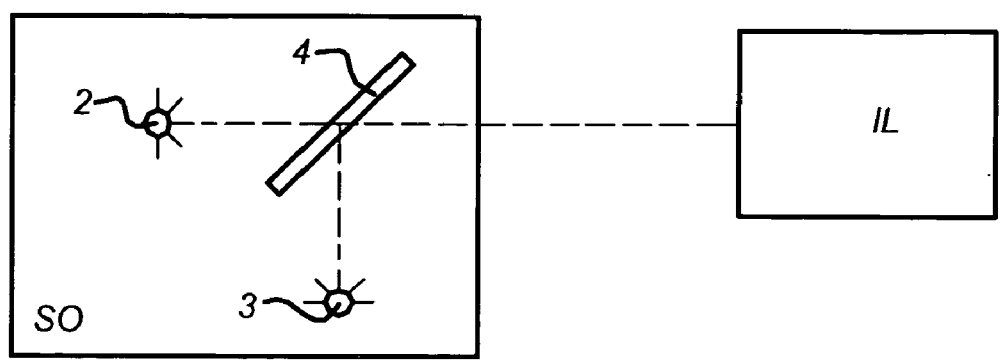
FIG. 2 shows a simplified diagrammatic view of a first embodiment of the source of radiation SO of the lithographic apparatus of FIG. 1 in more detail.

FIG. 2 shows a simplified diagram of a first embodiment of the source of radiation SO of the lithographic apparatus of FIG. 1 in more detail. In this embodiment, the source SO includes two radiation source elements 2, 3. The first radiation source element 2 radiates at a primary, first wavelength, which is used in the normal operation of the lithographic apparatus, and e.g. comprises an EUV source providing radiation at 13 nm to the illumination system IL, for example.

The second radiation source element 3 radiates at a second wavelength, which may be used in the lithographic apparatus during the time in which an ultra high vacuum environment is not yet reached. The second wavelength may advantageously be in the region from 150 to 350 nm. Although the mirrors and optics used in the lithographic apparatus are designed for the EUV radiation (at 13 nm), reflection will also occur at the second wavelength. The mask and optics which are designed for EUV radiation may not transmit radiation at the second wavelength very well (estimate is >2%), but still this is sufficient for many applications.

To enable the radiation from the second radiation source element 3 to reach the lithographic apparatus, a movable mirror 4 is provided. During normal operation, the mirror 4 may be moved out of the beam path of the first radiation source element 2 towards the illumination system IL. The movable mirror 4 may also be implemented using a tilting mirror arrangement, in which the mirror 4 may be positioned in the orientation shown in FIG. 2 during the pump down phase of the lithographic apparatus. The mirror 4 can be tilted away in the operational phase to allow radiation from the first radiation source element 2 to pass to the illumination system IL.

Figure 3:
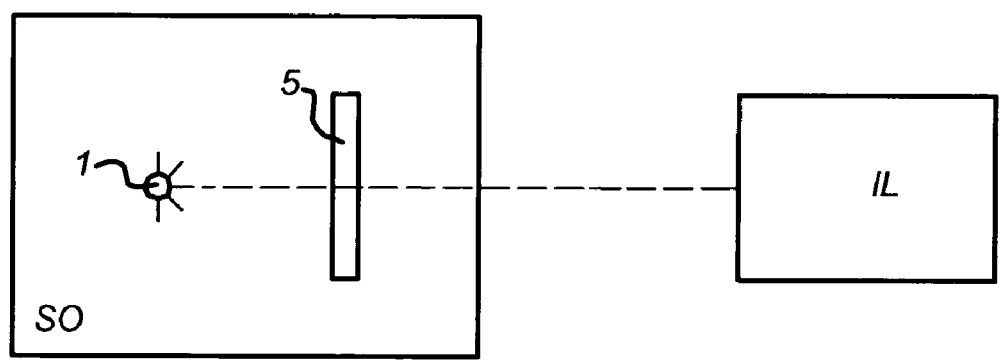
FIG. 3 shows a simplified diagrammatic view of a second embodiment of the source of radiation SO of the lithographic apparatus of FIG. 1 in more detail.

FIG. 3 shows a further embodiment of the radiation source SO according to the present invention. In this embodiment, the radiation source SO includes a single radiation source 1, which emits radiation both at the first wavelength, and at the second wavelength. A filter 5 is positioned between the radiation source 1 and the illumination system IL in order to pass only e.g. the second wavelength radiation. A second filter (not shown) may be used to pass radiation at the first wavelength only, and the choice between first and second wavelength may be made by accordingly positioning the first filter 5 or the second filter in the radiation beam path. Alternatively, a filter 5 is used which only passes radiation at the first wavelength in the operational state of the lithographic apparatus, and during the vacuuming phase, the filter 5 is removed, as the radiation at the first wavelength is absorbed by the still present molecules in the atmosphere.

The radiation at the second wavelength may be used during the period in which the ultra high vacuum is established in the lithographic apparatus. Possible uses are for setup of the lithographic apparatus, qualification, performance tests, such as mirror maps, and interferometer calibration. When using the second wavelength radiation for set up purposes, sensors may be used which are able to operate with the second wavelength, such as sensors known from other types of lithographic apparatus. Also, the second wavelength radiation may be used to expose further wafers (possibly using different types of masks) during the vacuuming period. In both cases, operational time is gained in which the lithographic apparatus can be used effectively.

The radiation sources described above with reference to the various embodiment, may be any type of radiation source, including discharge lamps.

The embodiments above have been described with reference to an EUV lithographic apparatus, in which the first, operational wavelength is around 13 nm. However, the multi wavelength radiation source according to the present invention may also be applied in other types of lithographic apparatus. Lithographic apparatus working with a primary operational wavelength of about 157 nm or about 193 nm also require a high vacuum environment. In these cases, the effective operational time of a lithographic apparatus can also be increased using a second wavelength radiation source.

While specific embodiments of the invention have been described above, it will be appreciated that the invention may be practiced otherwise than as described. The description is not intended to limit the invention.

What is claimed is:

1. A lithographic apparatus, comprising:
   a radiation source configured to provide radiation to an illumination system, the radiation source configured to provide an exposure radiation in a first wavelength range and an exposure radiation in a second wavelength range, the second wavelength range being different from the first wavelength range;
   a support configured to support a patterning device, the patterning device configured to impart the radiation with a pattern in its cross-section;
   a substrate table configured to hold a substrate;
   a projection system configured to project the patterned exposure radiation onto a target portion of radiation sensitive material of the substrate.

2. A lithographic apparatus according to claim 1, wherein the radiation source further comprises a radiation source capable of providing radiation in both the first and second wavelength range, and a removable filter configured to provide the radiation in the first or second wavelength range.

3. A lithographic apparatus according to claim 1, wherein the radiation source further comprises a first radiation source element configured to provide radiation in the first wavelength range, and a second radiation source element configured to provide radiation in the second wavelength range, and a removable radiation director configured to direct radiation from the second radiation source element to the illumination system.

4. A lithographic apparatus according to claim 1, wherein the first wavelength range is a wavelength range used in a controlled environment, and the second wavelength range is a wavelength range used when the controlled environment is not established.

5. A lithographic apparatus according to claim 1, wherein the first wavelength range is in an EUV region.

6. A lithographic apparatus according to claim 5, wherein the first wavelength is about 13 nm.

7. A lithographic apparatus according to claim 1, wherein the first wavelength range is in a UV region.

8. A lithographic apparatus according to claim 7, wherein the first wavelength is in a region between about 157 nm to 193 nm.

9. A lithographic apparatus according to claim 1, wherein the second wavelength range is used for setup of the lithographic apparatus, the setup comprising (i) calibration, or (ii) qualification, or (iii) performance test, or (iv) alignment, or (v) any combination of (i)-(iv).

10. A lithographic apparatus according to claim 1, wherein the substrate is exposed using the first wavelength range, and the second wavelength range is used for exposure of a further substrate.

11. A lithographic apparatus according to claim 5, wherein the second wavelength range is in a region between about 150 and 350 nm.

12. A device manufacturing method, comprising:
   providing exposure radiation at a first wavelength range and at an exposure radiation at a second wavelength range, the second wavelength range being different from the first wavelength range; and patterning the radiation in its cross-section; and projecting the patterned exposure radiation onto a target portion of radiation sensitive material of a substrate.

13. A method according to claim 12, further comprising filtering out radiation in the first or second wavelength range.

14. A method according to claim 12, further comprising directing radiation in the first or second wavelength range to an illumination system.

15. A method according to claim 12, wherein the first wavelength range is a wavelength range in which radiation propagates in a controlled environment, and the second wavelength range is a wavelength range in which radiation propagates when the controlled environment is not established.

16. A method according to claim 12, wherein the first wavelength range is in an EUV region.

17. A method according to claim 16, wherein the first wavelength is about 13 nm.

18. A method according to claim 12, wherein the first wavelength range is in a UV region.

19. A method according to claim 18, wherein the first wavelength is in a region between about 157 nm to 193 nm.

20. A method according to claim 12, further comprising using the second wavelength range for setup of a lithographic apparatus, the setup comprising (i) calibration, or (ii) qualification, or (iii) performance test, or (iv) alignment, or (v) any combination of (i)-(iv).

21. A method according to claim 12, further comprising using the first wavelength range for exposure of the substrate and using the second wavelength range for exposure of a further substrate.

22. A method according to claim 16, wherein the second wavelength range is in a region between about 150 and 350 nm.

23. A lithographic apparatus, comprising:

a radiation source configured to provide radiation to an illumination system, the radiation source configured to provide radiation in a first wavelength range and in a second wavelength range, the second wavelength range being different from the first wavelength range;

a support configured to support a patterning device, the patterning device configured to impart the radiation in the first wavelength range, or in the second wavelength range, or in both the first wavelength range and the second wavelength range, with a pattern in its cross-section;

a substrate table configured to hold a substrate;

a projection system configured to project the patterned radiation onto a target portion of the substrate, wherein the lithographic apparatus is configured so that the first wavelength range is used in a controlled ambient environment in the lithographic apparatus, and the second wavelength range is used when the controlled ambient environment is not established.

24. A lithographic apparatus according to claim 23, wherein the second wavelength range is used for setup of the lithographic apparatus, the setup comprising (i) calibration, or (ii) qualification, or (iii) performance test, or (iv) alignment, or (v) any combination of (i)-(iv).

25. A lithographic apparatus according to claim 23, wherein the first wavelength range is in an EUV region.

26. A lithographic apparatus according to claim 25, wherein the second wavelength range is in a region between about 150 and 350 nm.

27. A lithographic apparatus according to claim 23, wherein the controlled ambient environment is a vacuum environment and the period when the controlled ambient environment is not established comprises establishing the vacuum environment.

28. A device manufacturing method, comprising:

providing radiation at a first wavelength range and propagating the first wavelength range radiation in a controlled ambient environment;

providing radiation at a second wavelength range and propagating the second wavelength range radiation when the controlled ambient environment is not established, the second wavelength range being different from the first wavelength range;

patterning the radiation in the first wavelength range radiation, or the second wavelength range radiation, or both the first wavelength range radiation and the second wavelength range radiation, in its cross-section; and projecting the patterned radiation onto a target portion of a substrate.

29. A method according to claim 28, further comprising using the second wavelength range radiation for setup of a lithographic apparatus, the setup comprising (i) calibration, or (ii) qualification, or (iii) performance test, or (iv) alignment, or (v) any combination of (i)-(iv).

30. A method according to claim 28, wherein the first wavelength range is in an EUV region.

31. A method according to claim 30, wherein the second wavelength range is in a region between about 150 and 350 nm.

32. A method according to claim 28, wherein the controlled ambient environment is a vacuum environment and the period when the controlled ambient environment is not established comprises establishing the vacuum environment.

* * * * *